United States Patent
Yamashita et al.

(10) Patent No.: US 10,833,079 B2
(45) Date of Patent: Nov. 10, 2020

(54) DUAL TRANSPORT ORIENTATION FOR STACKED VERTICAL TRANSPORT FIELD-EFFECT TRANSISTORS

(71) Applicant: International Business Machines Corporation, Armonk, NY (US)

(72) Inventors: Tenko Yamashita, Schenectady, NY (US); Chen Zhang, Albany, NY (US); Kangguo Cheng, Schenectady, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/237,935

(22) Filed: Jan. 2, 2019

(65) Prior Publication Data
US 2020/0212036 A1  Jul. 2, 2020

(51) Int. Cl.
*H01L 29/66* (2006.01)
*H01L 27/092* (2006.01)
(Continued)

(52) U.S. Cl.
CPC ........ *H01L 27/092* (2013.01); *H01L 21/2256* (2013.01); *H01L 21/3065* (2013.01);
(Continued)

(58) Field of Classification Search
USPC ....................................... 257/329
See application file for complete search history.

(56) References Cited

U.S. PATENT DOCUMENTS 5,612,563 A  3/1997 Fitch et al.
7,288,821 B2  10/2007 Kwon
(Continued)

FOREIGN PATENT DOCUMENTS

CN  106206732 A  12/2016
CN  107154358 A  9/2017
WO  PCT/IB2019/060351  3/2020

OTHER PUBLICATIONS

B. Wu et al., "Pillar Dram Cell with Dual Channels and an Underneath Trench-in-Trench Capacitor Built on SOI Structure," IP.com No. IPCOM000106426D, Mar. 21, 2005, 5 pages.
(Continued)

*Primary Examiner* — Niki H Nguyen
(74) *Attorney, Agent, or Firm* — Douglas Pearson; Ryan, Mason & Lewis, LLP

(57) ABSTRACT

A semiconductor structure includes a substrate, a vertical fin disposed over a top surface of the substrate, a first vertical transport field-effect transistor (VTFET) disposed over the top surface of the substrate surrounding a first portion of the vertical fin, an isolation layer disposed over the first VTFET surrounding a second portion of the vertical fin, and a second VTFET disposed over a top surface of the isolation layer surrounding a third portion of the vertical fin. The first portion of the vertical fin includes a first semiconductor layer with a first crystalline orientation providing a first vertical transport channel for the first VTFET, the second portion of the vertical fin includes an insulator, and the third portion of the vertical fin includes a second semiconductor layer with a second crystalline orientation providing a second vertical transport channel for the second VTFET.

25 Claims, 10 Drawing Sheets

(51) Int. Cl.

| | | |
|---|---|---|
| *H01L 29/78* | (2006.01) | |
| *H01L 29/06* | (2006.01) | |
| *H01L 27/02* | (2006.01) | |
| *H01L 29/04* | (2006.01) | |
| *H01L 29/08* | (2006.01) | |
| *H01L 29/417* | (2006.01) | |
| *H01L 21/8238* | (2006.01) | |
| *H01L 21/822* | (2006.01) | |
| *H01L 21/3065* | (2006.01) | |
| *H01L 21/225* | (2006.01) | |
| *H01L 21/311* | (2006.01) | |
| *H01L 21/308* | (2006.01) | |
| *H01L 29/10* | (2006.01) | |
| *H01L 21/324* | (2006.01) | |
| *H01L 21/02* | (2006.01) | |
| *H01L 29/36* | (2006.01) | |
| *H01L 21/265* | (2006.01) | |

(52) U.S. Cl.
CPC .... *H01L 21/3081* (2013.01); *H01L 21/31111* (2013.01); *H01L 21/8221* (2013.01); *H01L 21/823814* (2013.01); *H01L 21/823871* (2013.01); *H01L 21/823878* (2013.01); *H01L 21/823885* (2013.01); *H01L 27/0207* (2013.01); *H01L 29/045* (2013.01); *H01L 29/0649* (2013.01); *H01L 29/0847* (2013.01); *H01L 29/1037* (2013.01); *H01L 29/41741* (2013.01); *H01L 29/6656* (2013.01); *H01L 29/7827* (2013.01); *H01L 21/0217* (2013.01); *H01L 21/02129* (2013.01); *H01L 21/26513* (2013.01); *H01L 21/324* (2013.01); *H01L 29/36* (2013.01)

(56) References Cited

U.S. PATENT DOCUMENTS

| | | | |
|---|---|---|---|
| 7,683,428 | B2 | 3/2010 | Chidambarrao et al. |
| 7,892,956 | B2 | 2/2011 | Deligianni et al. |
| 9,177,890 | B2 | 11/2015 | Du |
| 9,659,963 | B2 | 5/2017 | Cheng et al. |
| 9,721,845 | B1 | 8/2017 | Cheng et al. |
| 9,748,380 | B1 | 8/2017 | Lie et al. |
| 2007/0210301 | A1* | 9/2007 | Han .............. H01L 29/165 257/18 |
| 2016/0043074 | A1 | 2/2016 | Hurley et al. |
| 2017/0025412 | A1 | 1/2017 | Jun et al. |
| 2017/0141220 | A1 | 5/2017 | Ching et al. |
| 2017/0358500 | A1 | 12/2017 | Lin et al. |
| 2018/0053690 | A1* | 2/2018 | Wang .............. H01L 21/8221 |
| 2018/0090489 | A1 | 3/2018 | Bi et al. |
| 2020/0006331 | A1* | 1/2020 | Lilak .............. H01L 29/66795 |

OTHER PUBLICATIONS

U.S. Appl. No. 16/106,396 filed in the name of Rugiang Bao et al. filed Aug. 21, 2018 and entitled "Method and Structure of Replacement Metal Gate Schemes to Achieve Desired Multi-VTS and Better Electrical Data for VTFET."

* cited by examiner

Y X ←→ X'
↑
↓
Y'

100

Y X ←→ X'
↑
↓
Y'

200

US 10,833,079 B2

DUAL TRANSPORT ORIENTATION FOR STACKED VERTICAL TRANSPORT FIELD-EFFECT TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming stacked vertical transport field-effect transistors with dual transport orientation.

In one embodiment, a semiconductor structure comprises a substrate, at least one vertical fin disposed over a top surface of the substrate, a first vertical transport field-effect transistor disposed over the top surface of the substrate surrounding a first portion of the at least one vertical fin, an isolation layer disposed over the first vertical transport field-effect transistor surrounding a second portion of the at least one vertical fin, and a second vertical transport field-effect transistor disposed over a top surface of the isolation layer surrounding a third portion of the at least one vertical fin. The first portion of the at least one vertical fin comprises a first semiconductor layer with a first crystalline orientation providing a first vertical transport channel for the first vertical transport field-effect transistor. The second portion of the at least one vertical fin comprises an insulator. The third portion of the at least one vertical fin comprises a second semiconductor layer with a second crystalline orientation providing a second vertical transport channel for the second vertical transport field-effect transistor.

In another embodiment, an integrated circuit comprises a stacked vertical transport field-effect transistor structure comprising a substrate, at least one vertical fin disposed over a top surface of the substrate, a first vertical transport field-effect transistor disposed over the top surface of the substrate surrounding a first portion of the at least one vertical fin, an isolation layer disposed over the first vertical transport field-effect transistor surrounding a second portion of the at least one vertical fin, and a second vertical transport field-effect transistor disposed over a top surface of the isolation layer surrounding a third portion of the at least one vertical fin. The first portion of the at least one vertical fin comprises a first semiconductor layer with a first crystalline orientation providing a first vertical transport channel for the first vertical transport field-effect transistor, the second portion of the at least one vertical fin comprises an insulator, and the third portion of the at least one vertical fin comprises a second semiconductor layer with a second crystalline orientation providing a second vertical transport channel for the second vertical transport field-effect transistor.

In another embodiment, a method of forming a semiconductor structure comprises forming at least one vertical fin over a top surface of a substrate, forming a first vertical transport field-effect transistor over the top surface of the substrate surrounding a first portion of the at least one vertical fin, forming an isolation layer over the first vertical transport field-effect transistor surrounding a second portion of the at least one vertical fin, and forming a second vertical transport field-effect transistor over a top surface of the isolation layer surrounding a third portion of the at least one vertical fin. The first portion of the at least one vertical fin comprises a first semiconductor layer with a first crystalline orientation providing a first vertical transport channel for the first vertical transport field-effect transistor, the second portion of the at least one vertical fin comprises an insulator, and the third portion of the at least one vertical fin comprises a second semiconductor layer with a second crystalline orientation providing a second vertical transport channel for the second vertical transport field-effect transistor.

DETAILED DESCRIPTION

Figure 1:
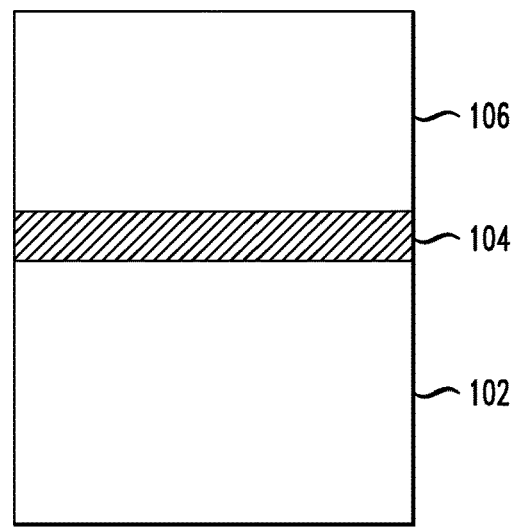
FIG. 1 depicts a cross-sectional view of a semiconductor on insulator on semiconductor substrate, according to an embodiment of the invention.

Illustrative embodiments of the invention may be described herein in the context of illustrative methods for forming stacked vertical transport field-effect transistors with dual transport orientation, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 7 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration. VTFETs may further provide advantages in stacking FETs.

Illustrative embodiments provide techniques for forming stacked VTFETs with favorable channel orientations. In some embodiments, a silicon-on-insulator (SOI) wafer is used to form stacked VTFETs, where the substrate and SOI layer have different crystalline orientations. Thus, stacked VTFETs of different types (e.g., nFET or pFET) may be made from the SOI layer and from the substrate below the buried oxide (BOX) insulator. The crystalline orientation of the SOI and substrate below the BOX insulator may be chosen to have nFET and pFET devices with optimized transport surfaces and orientation. Using techniques described herein, a stacked VTFET structure may be formed where a FET of a first type (e.g., one of nFET and pFET) sits directly on top of a FET of a second type (e.g., the other one of nFET and pFET), with a dielectric layer between the stacked VTFETs for isolation. The nFET and pFET channel may have different surface and transport orientations.

In some embodiments, stacked VTFETs are formed wherein the upper VTFET is made of a monocrystalline semiconductor of a different crystalline orientation from the crystalline orientation of the lower VTFET. Such stacked VTFETs may be formed starting with a SOI wafer, where the bulk substrate is of a first crystalline orientation (e.g., (110)) and the SOI layer is of a second crystalline orientation (e.g., (100)) different from the first crystalline orientation. The SOI wafer is etched to form one or more fins comprising the SOI, BOX and a certain thickness of the bulk silicon below. A bottom junction is formed and activated for a source/drain contact of the lower VTFET (e.g., an nFET), followed by formation of a bottom spacer, a gate stack and a top spacer for the lower VTFET. A silicate glass layer (e.g., phosphosilicate glass (PSG)) is then deposited, followed by formation of an isolation layer (e.g., silicon nitride (SiN)). Next, the upper VTFET (e.g., a pFET) is formed by depositing a bottom silicate glass layer (e.g., borosilicate glass (BSG)), followed by formation of a bottom spacer, a gate stack, and a top spacer for the upper VTFET. A top silicate glass layer is formed over the top spacer for the upper VTFET. A dopant drive-in anneal is formed to dope the bottom and top junctions or source/drain regions for the upper and lower VTFETs in the stack. An interlayer dielectric (ILD) is then deposited.

The ILD and underlying layers are then patterned and etched to form contacts for the upper and lower VTFETs. In some embodiments, the ILD layer is patterned and an opening to the bottom silicate glass layer of the upper VTFET is formed. A sidewall spacer is formed to protect the gate stack of the upper VTFET. The bottom silicate glass layer of the upper VTFET is then removed, and refilled with a contact material that wraps around the bottom junction or source/drain of the upper VTFET. The ILD may also be patterned and etched down to the silicate glass layer of the lower VTFET (e.g., the silicate glass layer surrounding the top junction or source/drain region of the lower VTFET). The silicate glass layer of the lower VTFET may then be removed and refilled with a contact material that wraps around the top junction or source/drain of the lower VTFET. In some embodiments, the ILD may be patterned and etched down to form a shared contact between the bottom junction or source/drain of the upper VTFET and the top junction or source/drain of the lower VTFET. The ILD may further be patterned to form an opening to the top junction or source/drain of the upper VTFET, and to complete remaining contacts to the bottom junction or source/drain of the lower VTFET and to the gate stacks of the upper and lower VTFETs. As a result, stacked VTFET devices are formed with different channel or transport orientations.

Illustrative processes for forming stacked VTFET structures with dual transport orientation will now be described with respect to FIGS. 1-16.

FIG. 1 shows a cross-sectional view 100 of a bulk substrate 102, an insulator layer 104 formed over the bulk substrate 102, and a semiconductor layer 106 formed over the insulator layer 104. The semiconductor layer 106 and insulator 104 may form a thin-BOX SOI.

The bulk substrate 102 and semiconductor layer 106 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The horizontal thickness or width (in direction X-X') of the FIG. 1 structure may vary, such as based on the number of fins that are to be formed therefrom as described in further detail below. The vertical thickness or height (in direction Y-Y') of the FIG. 1 structure may be in the range of 100 nm to 500 nm, although other heights above or below this range may be used as desired for a particular application.

The bulk substrate 102 and semiconductor layer 106 have different crystalline orientations, suitable for formation of different types of VTFET devices (e.g., nFETs and pFETs). In the description below, it is assumed that the FIG. 1 structure is used to form a stacked VTFET structure where the lower VTFET is an nFET device and the upper VTFET is a pFET device. It is further assumed that both the substrate 102 and semiconductor layer 106 are formed of silicon, although as noted above this is not a requirement. The substrate 102 has a first crystalline orientation (110) suited for formation of an nFET device, and the semiconductor layer 106 has a second crystalline orientation (100) suited for formation of a pFET device. It should be appreciated, however, that to form a stacked VTFET structure where the lower VTFET is a pFET device and the upper VTFET is an nFET device, the crystalline orientations may be reversed (e.g., where the substrate 102 has a crystalline orientation of (100) while the semiconductor layer 106 has a crystalline orientation of (110)).

For clarity of illustration, FIGS. 1-16 are shown and described with respect to forming a stacked VTFET structure with just two VTFETs vertically stacked (e.g., in direction Y-Y'). In other embodiments, however, a stacked VTFET structure may include three or more VTFETs vertically stacked. Further, while FIGS. 1-16 are described with respect to stacking a VTFET of one type on top of a VTFET of another type (e.g., where the upper VTFET is a pFET device and the lower VTFET is an nFET device), embodiments are not so limited. For example, the upper and lower VTFETs may both be nFET devices or pFET devices. Further, the stacked VTFETs may include any number of nFET devices formed over any number of pFET devices as desired for a particular application.

Figure 2:
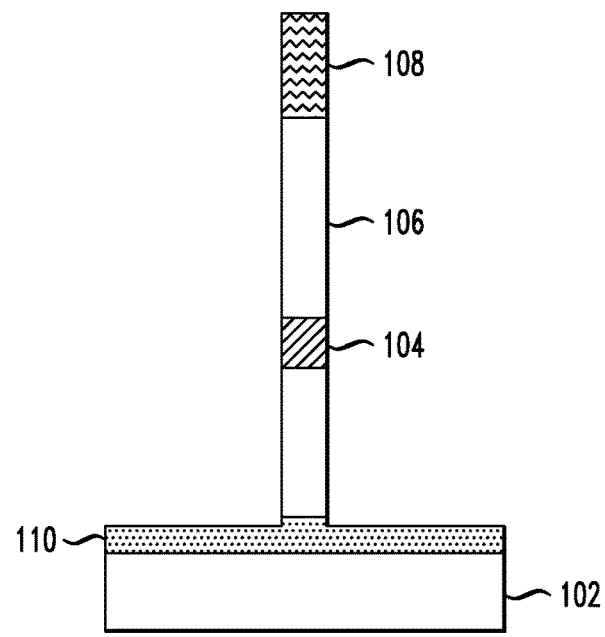
FIG. 2 depicts a cross-sectional view of the FIG. 1 structure following formation of a vertical fin and a bottom junction, according to an embodiment of the invention.

FIG. 2 shows a cross-sectional view 200 of the FIG. 1 structure following formation of a vertical fin from the semiconductor layer 106, insulator layer 104 and at least a portion of the substrate 102. The vertical fin may be formed using sidewall image transfer (SIT) or other suitable techniques such as lithography and etching including reactive-ion etching (ME), etc. As shown, a hard mask layer (HM) 108 is patterned over the top surface of the semiconductor layer 106.

The HM 108 may be formed of a nitride such as SiN, although other suitable materials may be used. The HM 108, in some embodiments, may be formed as a multi-layer, such as a multi-layer of two layers including a nitride and oxide (e.g., SiN and silicon dioxide ($SiO_2$)), a multi-layer of three layers including one or more nitride and one or more oxide layers (e.g., $SiN/SiO_2/SiN$, $SiO_2/SiN/SiO_2$), etc. The HM 108 may have a height or vertical thickness (in direction Y-Y') in the range of 10 nm to 100 nm, although other heights above or below this range may be used as desired for a particular application.

The vertical fin may have a width or horizontal thickness (in direction X-X') in the range of 6 nm to 10 nm, although other widths above or below this range may be used as desired for a particular application. The vertical fin may have a height or vertical thickness (in direction Y-Y') ranging from 60 nm to 400 nm, although other heights above or below this range may be used as desired for a particular application.

Although FIG. 2 shows just a single vertical fin being formed from the FIG. 1 structure for clarity of illustration, it should be appreciated that multiple vertical fins may be formed from the FIG. 1 structure to form multiple stacked VTFET structures.

Although not shown in FIG. 2, an interfacial layer may be formed on sidewalls of the vertical fin. The interfacial layer may be formed of $SiO_2$ or another suitable material such as silicon oxynitride ($SiO_xN_y$). The interfacial layer may have a width or horizontal thickness (in direction X-X') ranging from 0.5 nm to 1.5 nm, although other widths above or below this range may be used as desired for a particular application.

The FIG. 2 structure also shows formation of a bottom junction or bottom source/drain region 110. The bottom source/drain region 110 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 110 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

In some embodiments, it is assumed that the bottom junction is formed via ion implantation (e.g., $BF_2+$ or P+ with an energy of 5 keV and a dose of 2e15 for pFET and nFET, respectively). Following implantation, an activation anneal may be performed (e.g., a spike rapid thermal anneal (RTA) at 1000° C.).

The bottom source/drain region 110 may have a height or vertical thickness (in direction Y-Y') in the range of 20 nm to 50 nm, although other heights above or below this range may be used as desired for a particular application.

Figure 3:
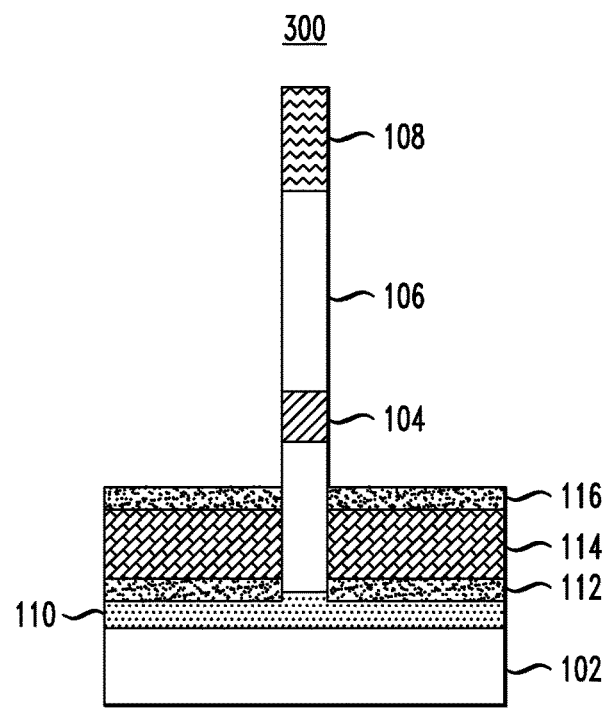
FIG. 3 depicts a cross-sectional view of the FIG. 2 structure following formation of a first bottom spacer, a first gate stack and a first top spacer, according to an embodiment of the invention.

FIG. 3 shows a cross-sectional view 300 of the FIG. 2 structure following the formation of a bottom spacer 112, a gate stack 114, and a top spacer 116.

The bottom spacer 112 and top spacer 116 may each be formed using various processing, such as non-conformal deposition and etch-back processing (e.g., physical vapor deposition (PVD), high density plasma (HDP) deposition, etc.). The bottom spacer 112 and top spacer 116 may be formed of $SiO_2$, SiN, silicon carbide oxide (SiCO), silicon boron carbide nitride (SiBCN), etc., although other suitable materials may be used. The bottom spacer 112 and top spacer 116 may each have a height or vertical thickness (in direction Y-Y') in the range of 4 nm to 10 nm, although other heights above or below this range may be used as desired for a particular application.

The gate stack 114 includes a gate dielectric disposed adjacent sidewalls of the vertical fin, and a gate conductor formed over the gate dielectric. The gate dielectric may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric may have a uniform thickness in the range of 1 nm to 3 nm, although other thicknesses above or below this range may be used as desired for a particular application.

The gate conductor may include a metal gate or work function metal (WFM). In some embodiments, the gate conductor is formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of TiN or another suitable material) followed by one or more of the aforementioned WFM materials, etc. For pFET devices, the WFM for the gate conductor may be TiN, TaN, or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired.

The gate stack 114 may have a height or vertical thickness (in direction Y-Y') in the range of 10 nm to 20 nm, although other thicknesses above or below this range may be used as desired for a particular application.

Figure 4:
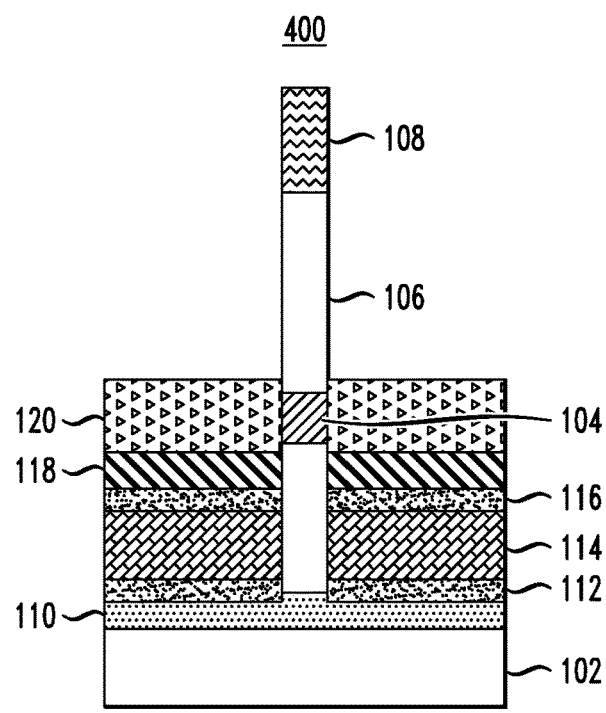
FIG. 4 depicts a cross-sectional view of the FIG. 3 structure following formation of a first silicate glass layer and an isolation spacer, according to an embodiment of the invention.

FIG. 4 shows a cross-sectional view 400 of the FIG. 3 structure following formation of a silicate glass layer 118 and an isolation spacer 120. As noted above, it is assumed that the lower or bottom VTFET is an nFET device, and thus the silicate glass layer 118 may be phosphosilicate glass (PSG) 118, such that during dopant drive-in n-type dopants are formed in the vertical fin to form the top junction or top source/drain region for the lower VTFET. It should be appreciated that if the lower VTFET is a pFET device, the type of silicate glass may be altered (e.g., borosilicate glass (BSG) may be used rather than PSG). Further, other types of silicate glass may be used in place of BSG and/or PSG such that other dopants may be driven in to the vertical fin to form the top junction or top source/drain region for the lower VTFET.

The PSG layer 118 may be deposited using any suitable technique, such as chemical vapor deposition (CVD). The PSG layer 118 may have a height or vertical thickness (in direction Y-Y') in the range of 10 nm to 30 nm, although other thicknesses above or below this range may be used as desired for a particular application.

The isolation layer 120 is formed over the PSG layer 118. The isolation layer 120 may be deposited using any suitable technique, such as gas cluster ion beam (GCIB) directional deposition. The isolation layer 120 serves to isolate the lower VTFET from the upper VTFET formed surrounding the vertical fin. As noted above, in some embodiments it is assumed that the lower VTFET is an nFET device and the upper VTFET is a pFET device, and thus the isolation layer 120 provides an n-p isolation spacer. The isolation layer 120 may be formed of silicon nitride ($SiN_x$) or another suitable material. The isolation layer 120 may have a height or vertical thickness (in direction Y-Y') ranging from 20 nm to 50 nm, although other thicknesses above or below this range may be used as desired for a particular application.

Figure 5:
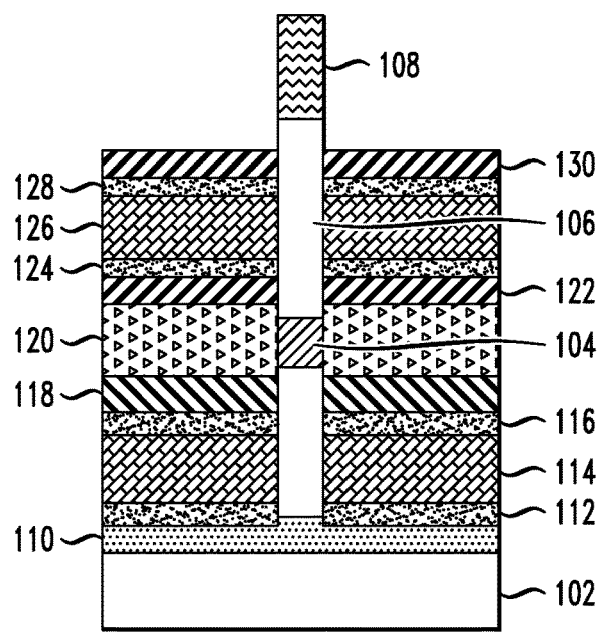
FIG. 5 depicts a cross-sectional view of the FIG. 4 structure following forming of a second silicate glass layer, a second bottom spacer, a second gate stack, a second top spacer, and a third silicate glass layer, according to an embodiment of the invention.

FIG. 5 shows a cross-sectional view 500 of the FIG. 4 structure following formation of a silicate glass layer 122, a bottom spacer 124, a gate stack 126, a top spacer 128 and a silicate glass layer 130. As noted above, in some embodiments it is assumed that the upper VTFET is a pFET device, and thus the silicate glass layers 122 and 124 may be formed of BSG and are also referred to herein as bottom BSG layer 122 and top BSG layer 124. If the upper VTFET is an nFET device, the layers 122 and 124 may be PSG or another suitable material as described above. The bottom and top BSG layers 122 and 124 may each have a height or vertical thickness (in direction Y-Y') similar to that of the PSG layer 118.

The bottom spacer 124 and top spacer 128 may be formed of similar materials, with similar sizing and using similar processing as that described above with respect to bottom spacer 112 and top spacer 116. The gate stack 126 may be formed of similar materials, with similar sizing and using similar processing as that described above with respect to gate stack 114.

Figure 6:
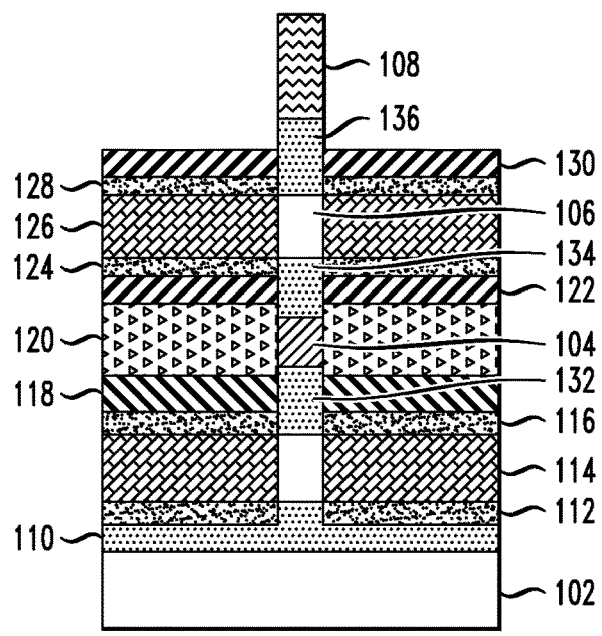
FIG. 6 depicts a cross-sectional view of the FIG. 5 structure following dopant drive-in from the silicate glass layers, according to an embodiment of the invention.

FIG. 6 shows a cross-sectional view 600 of the FIG. 5 structure following dopant drive-in from the silicate glass layers 118, 122 and 130 to form the top junction or top source/drain region 132 for the lower VTFET, the bottom junction or bottom source/drain region 134 for the upper VTFET, and the top junction or top source/drain region 136 for the upper VTFET, respectively. The dopant drive-in process may include a rapid thermal anneal (RTA) at a temperature in the range of 900° C. to 1200° C. As shown in FIG. 6, the dopant drive-in may also cause the doped region 110 at the bottom of the fin to get "taller" as the dopants in the doped region 110 may diffuse upward during the drive-in anneal.

The type of silicate glass used in the layers 118, 122 and 130 is selected to form the appropriate type of junction. As the lower VTFET is assumed to be an nFET device, the silicate glass layer 118 is PSG and an n-type dopant P+ is driven in to the vertical fin as illustrated to form top source/drain region 132 for the lower VTFET. As the upper VTFET is assumed to be a pFET device, the silicate glass layers 122 and 130 are BSG and a p-type dopant B+ is driven in to the vertical fin as illustrated to form the bottom and top source/drain regions 134 and 136, respectively.

Figure 7:
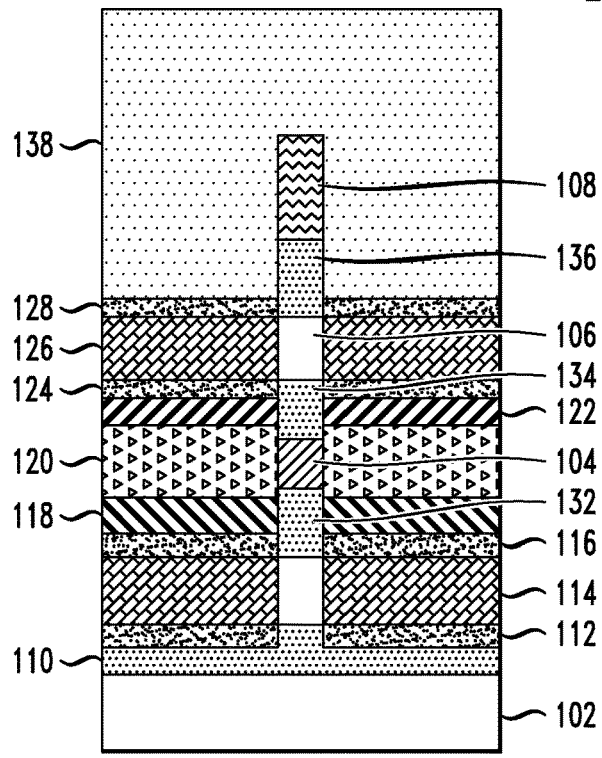
FIG. 7 depicts a cross-sectional view of the FIG. 6 structure following deposition of an interlayer dielectric, according to an embodiment of the invention.

FIG. 7 shows a cross-sectional view 700 of the FIG. 6 structure following removal of the top BSG layer 130 and following formation of ILD 138. The ILD 138 may be formed of any suitable isolating material, such as $SiO_2$, SiOC, SiON, etc. The ILD 138 may have a height or vertical thickness (in direction Y-Y') in the range of 40 nm to 200 nm, although other thicknesses above or below this range may be used as long as the ILD 138 fully encapsulates the HM 108.

Figure 8:
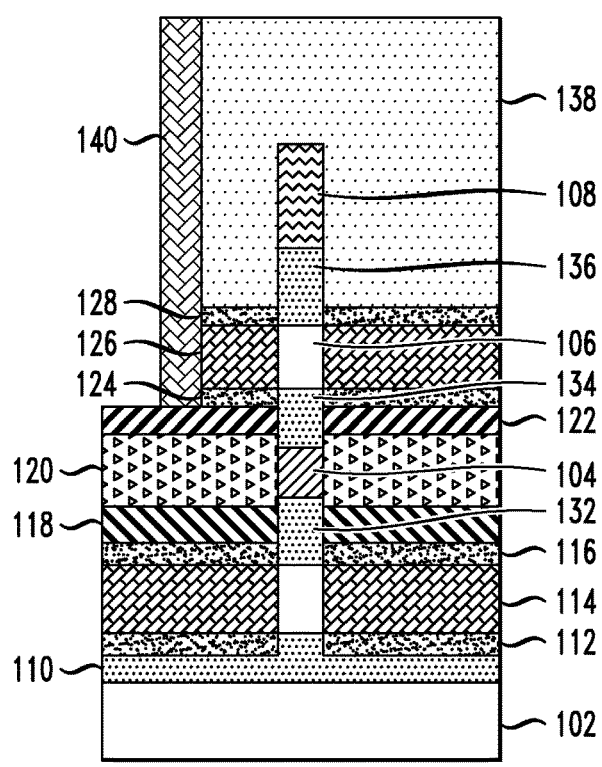
FIG. 8 depicts a cross-sectional view of the FIG. 7 structure following etching down to the second silicate glass layer and formation of a sidewall spacer to protect the second gate stack, according to an embodiment of the invention.
Figure 9:
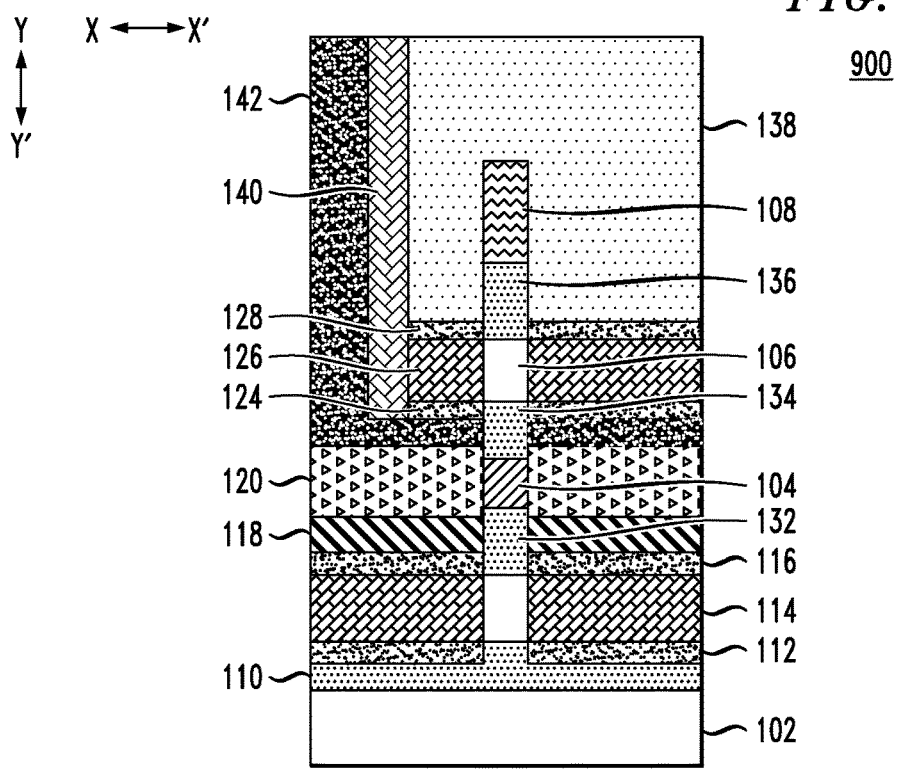
FIG. 9 depicts a cross-sectional view of the FIG. 8 structure following removal of the second silicate glass layer and formation of a contact material, according to an embodiment of the present invention.

FIGS. 8-16 show examples of ways to form contacts to the stacked VTFETs of FIG. 7. More particularly, FIGS. 8 and 9 illustrate formation of a contact to the bottom source/drain region 134 of the upper VTFET.

FIG. 8 shows a cross-sectional view 800 of the FIG. 7 structure, following etching (e.g., using ME) down to the bottom BSG layer 122. This etching may be achieved by suitably masking and exposing the top surface of the ILD 138. After etching, a sidewall spacer 140 is formed. The sidewall spacer 140 protects the gate stack 126. The sidewall spacer 140 may be formed of SiN, SiBCN, silicon oxycarbonitride (SiOCN) or another suitable material, using ALD followed by a directional etch. The sidewall spacer 140 may have a width or horizontal thickness (in direction X-X') ranging from 4 nm to 10 nm.

FIG. 9 shows a cross-sectional view 900 of the FIG. 8 structure, following removal of the bottom BSG layer 122 and following deposition or formation of contact material to form the bottom source/drain contact 142 for the upper VTFET. As shown, the bottom source/drain contact 142 wraps around the portion of the vertical fin that provides the bottom junction or bottom source/drain region 134. The contact material may be formed using any suitable deposition process, such as PVD, CVD, ALD, etc. The contact material may comprise tungsten (W), Ti, TiN, Ti/TiN, Ti/TiN plus cobalt (Co), etc.

Figure 10:
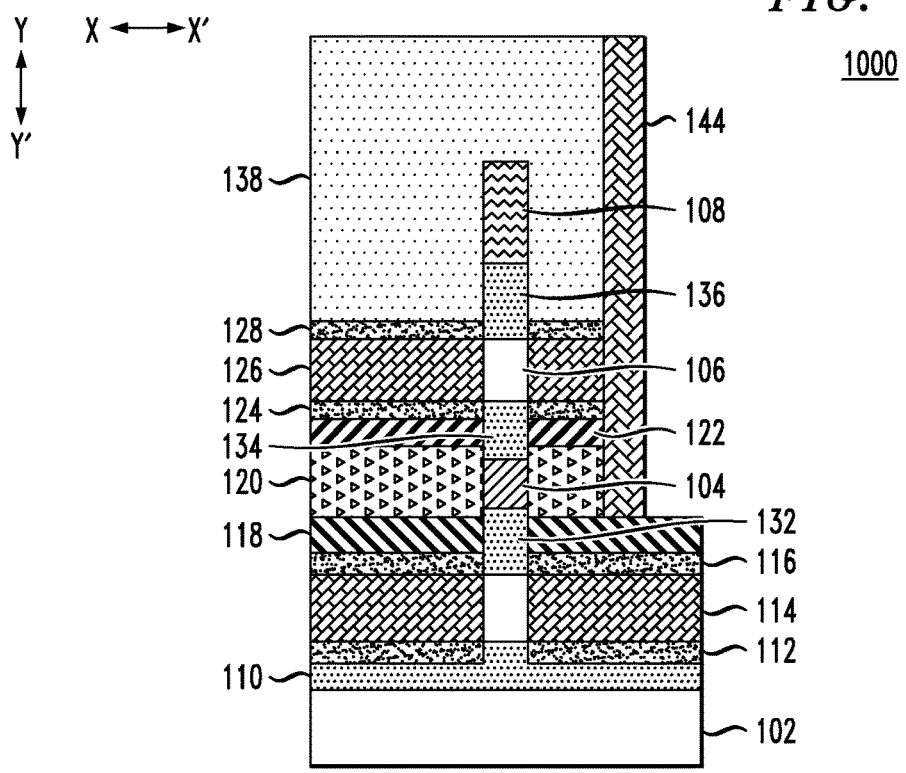
FIG. 10 depicts a cross-sectional view of the FIG. 7 structure following etching down to the first silicate glass layer and formation of a sidewall spacer to protect the second gate stack, according to an embodiment of the invention.
Figure 11:
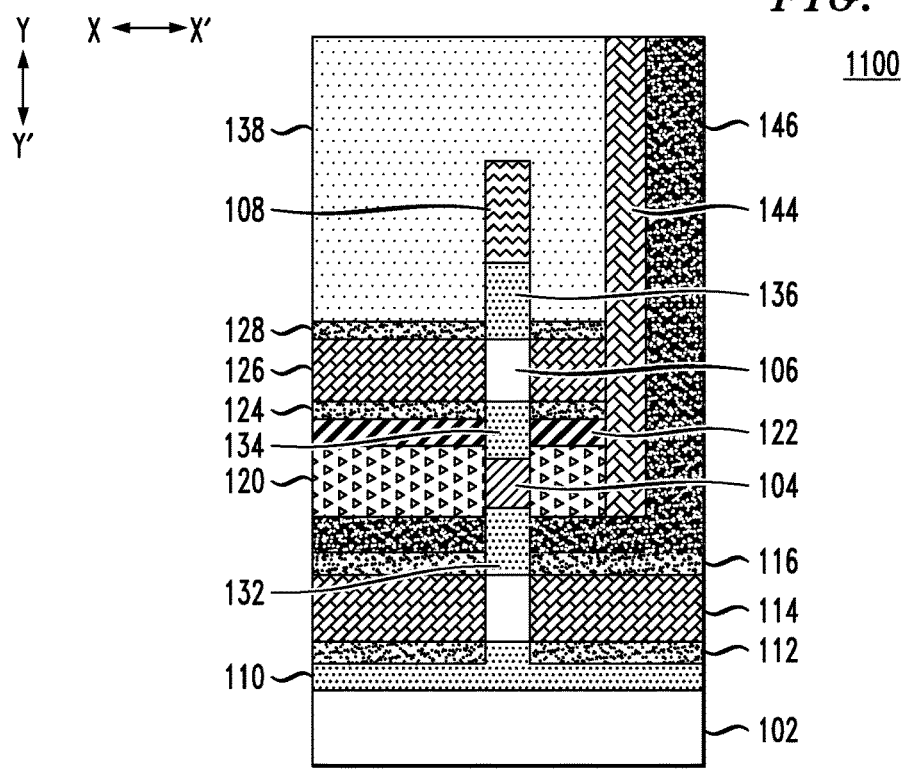
FIG. 11 depicts a cross-sectional view of the FIG. 10 structure following removal of the first silicate glass layer and formation of a contact material, according to an embodiment of the invention.

FIGS. 10 and 11 illustrate processing similar to that of FIGS. 8 and 9 but for formation of a contact to the top junction or top source/drain region 132 of the lower VTFET. FIG. 10 shows a cross-sectional view 1000 of the FIG. 7 structure following etching (e.g., using RIE) down to the PSG layer 118. After etching, a sidewall spacer 144 is formed to protect the gate stack 126. The sidewall spacer 144 may be formed of similar materials, with similar size, and using similar processing as that described above with respect to sidewall spacer 140.

FIG. 11 shows a cross-sectional view 1100 of the FIG. 10 structure following removal of the PSG layer 118 and following deposition or formation of contact material to form the top source/drain contact 146 for the lower VTFET. The top source/drain contact 146 may be formed of similar materials, with similar sizing, and using similar processing as that described above with respect to contact 142.

Figure 12:
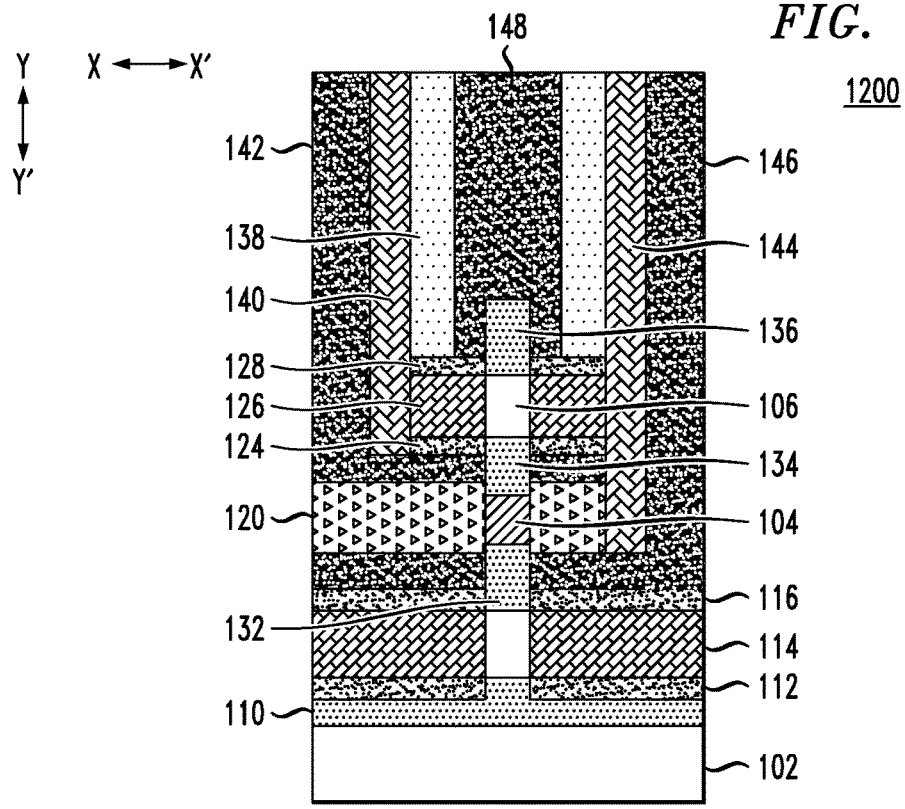
FIG. 12 depicts a cross-sectional view of the FIG. 7 structure following formation of a first contact to a bottom junction of the upper vertical transport field effect transistor, a second contact to the top junction of the lower vertical transport field-effect transistor, and a third contact to a top junction of the upper vertical field-effect transistor, according to an embodiment of the invention.

FIG. 12 illustrates formation of top and bottom source/drain contacts for the upper VTFET, and formation of the top source/drain contact for the lower VTFET. FIG. 12 shows a cross-sectional view 1200 of the FIG. 7 structure, following formation of the sidewall spacer 140, bottom source/drain contact 142 for the upper VTFET, sidewall spacer 144, and top source/drain contact 146 for the lower VTFET as shown and described above with respect to FIGS. 8-11. FIG. 12 further shows formation of a top source/drain contact 148 for the upper VTFET. The top source/drain contact 148 for the upper VTFET may be formed by patterning and etching the ILD 138, removing the HM 108, and depositing contact material. The top source/drain contact 148 may be formed of similar materials as that described above with respect to contact 142.

It should be appreciated that the contact arrangement shown in FIG. 12 is presented by way of example only. For example, while FIG. 12 illustrates an arrangement where separate contacts 142 and 146 are formed to the bottom source/drain region 134 of the upper VTFET and the top source/drain region 132 of the lower VTFET, this is not a requirement. In some embodiments, a shared contact is formed to the bottom source/drain region 134 of the upper VTFET and the top source/drain region 132 of the lower VTFET as illustrated in FIG. 13.

Figure 13:
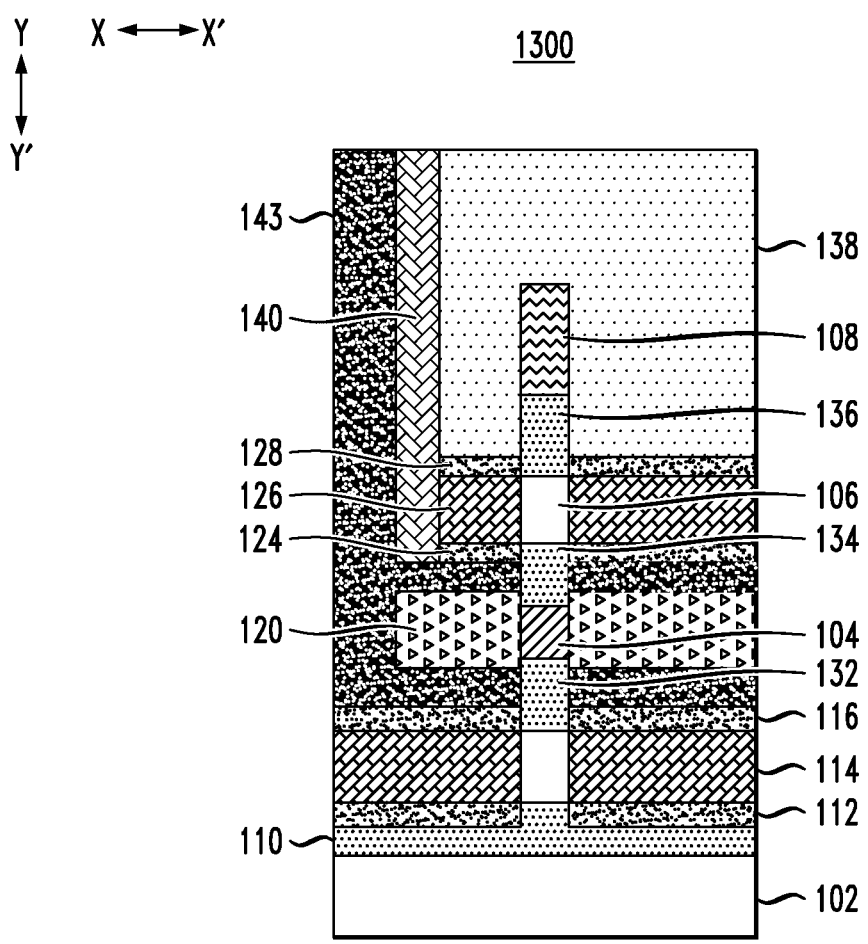
FIG. 13 depicts a cross-sectional view of the FIG. 7 structure following formation of a shared contact to a bottom junction of the upper vertical transport field-effect transistor and a top junction of the lower vertical transport field-effect transistor, according to an embodiment of the invention.

FIG. 13 shows a cross-sectional view 1300 of the FIG. 7 structure, following etching down to the PSG layer 118 and formation of the sidewall spacer 140. FIG. 13 also shows that the PSG layer 118 and the bottom BSG layer 122 are removed, and contact material is deposited to form a shared contact 143 between the bottom source/drain region 134 of the upper VTFET and the top source/drain region 132 of the lower VTFET.

Figure 14:
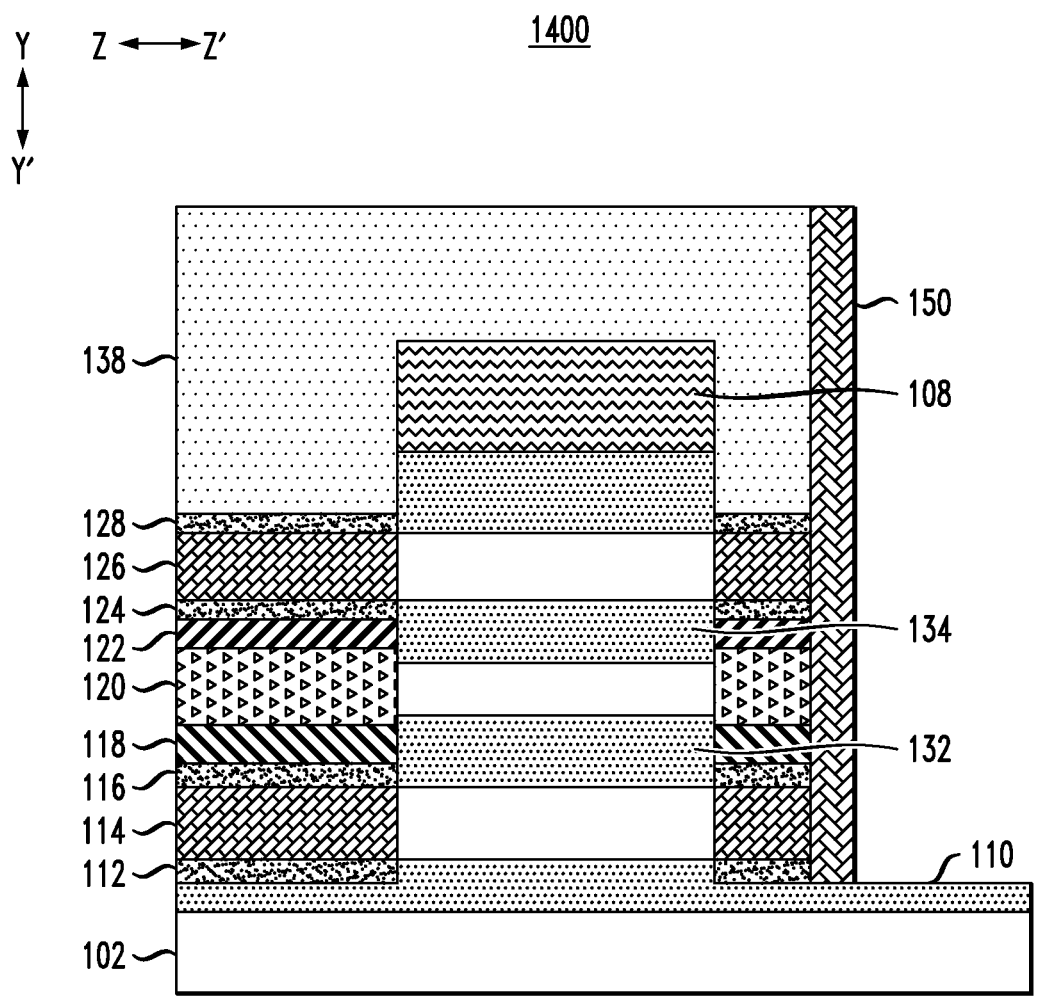
FIG. 14 depicts a cross-sectional view of the FIG. 7 structure following etching down to a bottom junction of the lower vertical transport field-effect transistor and formation of a sidewall spacer to protect the first gate stack and the second gate stack, according to an embodiment of the invention.
Figure 15:
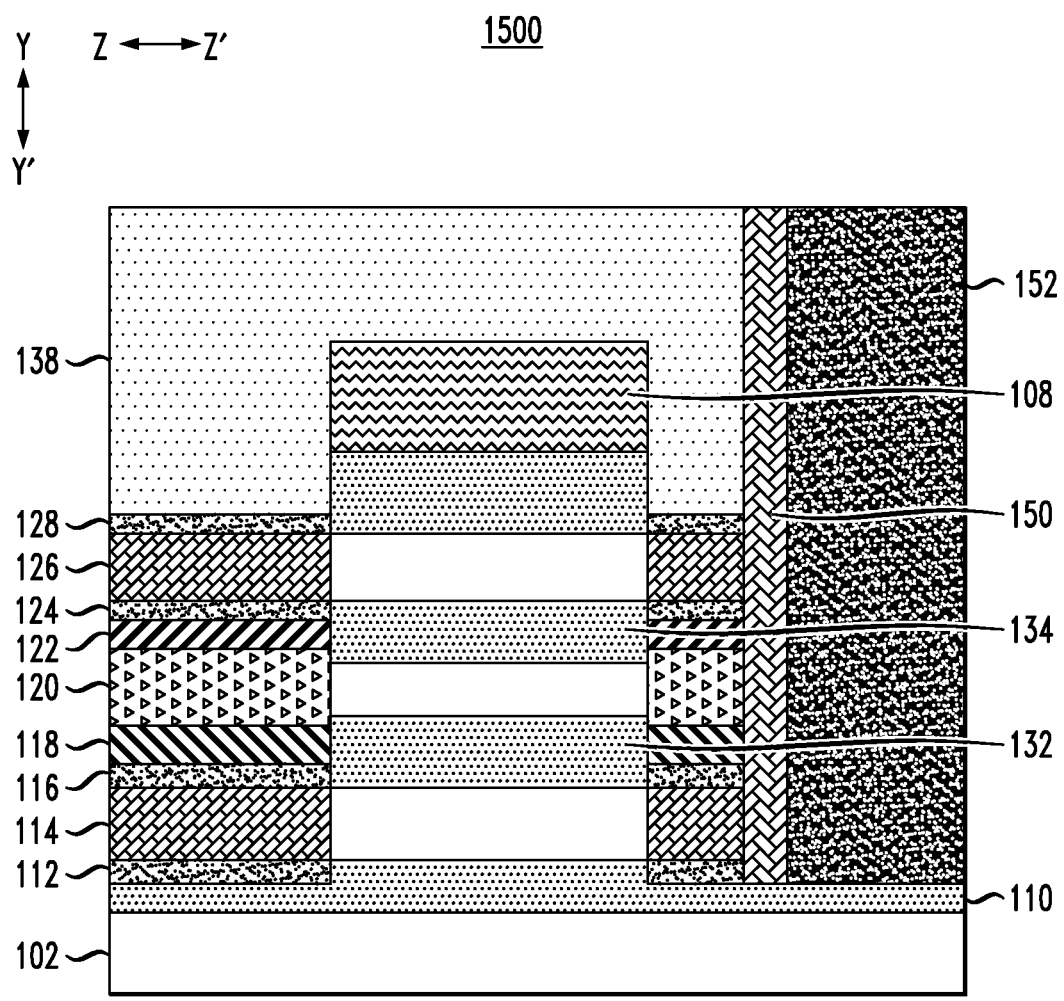
FIG. 15 depicts a cross-sectional view of the FIG. 13 structure following formation of a contact material, according to an embodiment of the invention.
Figure 16:
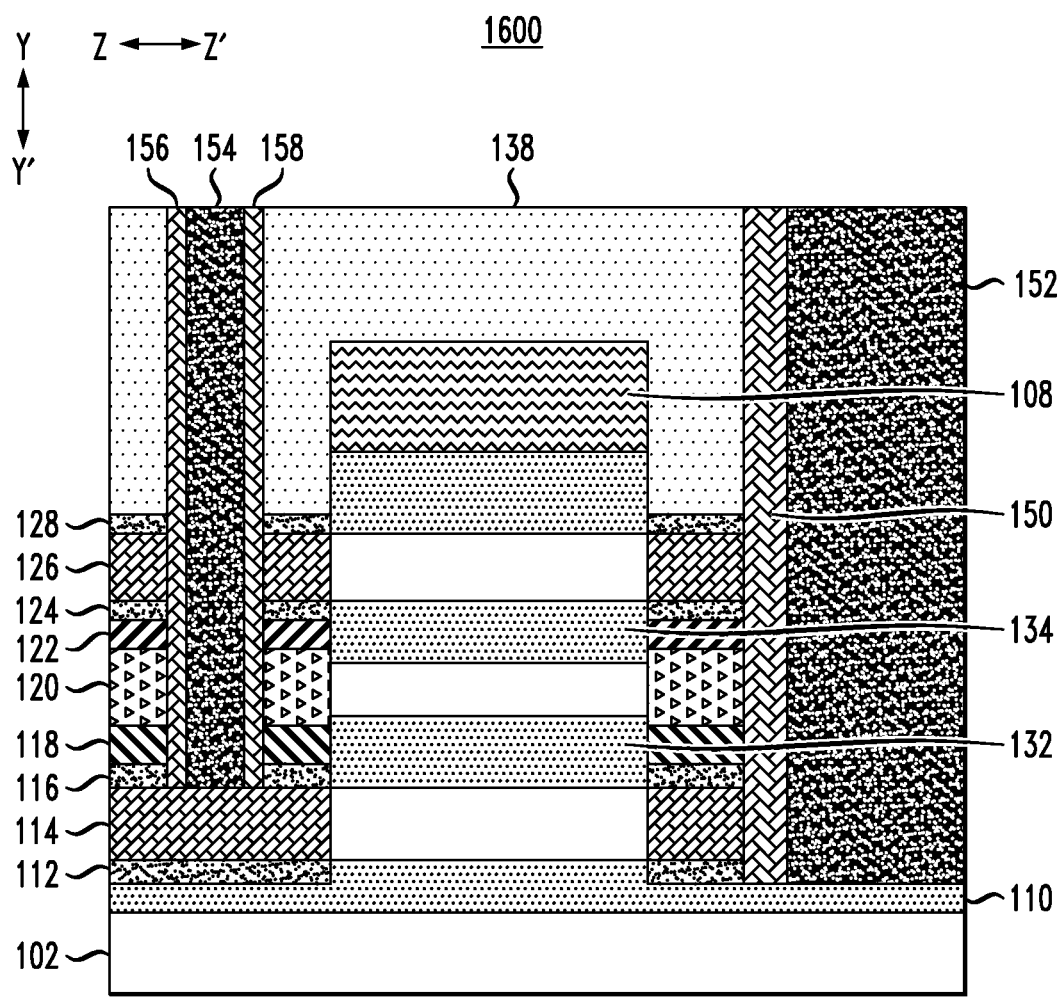
FIG. 16 depicts a cross-sectional view of the FIG. 14 structure following formation of a shared gate contact, according to an embodiment of the invention.

FIGS. 14-16 illustrate formation of contacts to the bottom source/drain region 110 of the lower VTFET, and formation of a shared gate contact to the gate stacks 114 and 126. While FIGS. 1-13 above are cross-sectional views taken "across" the vertical fin, FIGS. 14-16 show cross-sectional views taken along the "length" of the fin.

FIG. 14 shows a cross-sectional view 1400 of the FIG. 7 structure, following etching down to the bottom source/drain region 110 of the lower VTFET away from an edge of the vertical fin (e.g., some distance away from an end edge of the vertical fin in direction Z-Z' (which is perpendicular to direction X-X' of FIGS. 1-13). A sidewall spacer 150 is formed to protect the gate stacks 114 and 126. The sidewall spacer 150 may be formed of similar materials, with similar sizing and using similar processing as that described above with respect to sidewall spacer 140.

FIG. 15 shows a cross-sectional view 1500 of the FIG. 14 structure following deposition or formation of a contact material to form a bottom source/drain contact 152 for the lower VTFET. The bottom source/drain contact 152 may be formed of similar materials as the contact 142 described above.

FIG. 16 shows a cross-sectional view 1600 of the FIG. 15 structure following formation of a shared gate contact 154. The shared gate contact 154 is formed by patterning an opening and etching down to the gate stack 114, followed by deposition of contact material. The shared gate contact 154 may be formed of similar materials as the contact 142. Also shown are sidewall spacers 156 and 158, which prevent the shared gate contact 154 from shorting the top source/drain contact for the lower VTFET and the bottom source/drain contact for the upper VTFET. Alternatively, the PSG and BSG layers 118 and 122 may be patterned in a way that they are removed from the gate contact region and become a dielectric instead, thus ensuring that no short will occur. The sidewall spacers 156 and 158 may be formed of similar materials, with similar size, and using similar processing as that described above with respect to sidewall spacer 140. The shared gate contact 154, similar to the bottom source/ drain contact 152 of the lower VTFET, is formed some distance (in direction Z-Z') away from an end of the vertical fin (opposite the end where the bottom source/drain contact 152 for the lower VTFET is formed).

In some embodiments, a semiconductor structure comprises a substrate, at least one vertical fin disposed over a top surface of the substrate, a first VTFET disposed over the top surface of the substrate surrounding a first portion of the at least one vertical fin, an isolation layer disposed over the first VTFET surrounding a second portion of the at least one vertical fin, and a second VTFET disposed over a top surface of the isolation layer surrounding a third portion of the at least one vertical fin. The first portion of the at least one vertical fin comprises a first semiconductor layer with a first crystalline orientation providing a first vertical transport channel for the first VTFET, the second portion of the at least one vertical fin comprises an insulator, and the third portion of the at least one vertical fin comprises a second semiconductor layer with a second crystalline orientation providing a second vertical transport channel for the second VTFET.

The first crystalline orientation may provide a first vertical transport orientation for one of an nFET and a pFET), and the second crystalline orientation may provide a vertical transport orientation for the other one of an nFET and a pFET.

The first semiconductor layer may comprise silicon with one of a (110) crystalline orientation and a (100) crystalline orientation, and the second semiconductor layer may comprise silicon with the other one of the (110) crystalline orientation and the (100) crystalline orientation.

The semiconductor structure may further comprise a first bottom source/drain region for the first VTFET, the first bottom source/drain region comprising a doped region proximate the top surface of the substrate and a doped region of a first portion of the first semiconductor layer proximate the top surface of the substrate, a first bottom spacer disposed over the top surface of the substrate and surrounding the first portion of the first semiconductor layer, a first gate stack disposed over a top surface of the first bottom spacer and surrounding a second portion of the first semiconductor, a first top spacer disposed over a top surface of the first gate stack and surrounding a third portion of the first semiconductor layer, and a first top source/drain contact for the first VTFET disposed over a top surface of the first top spacer and surrounding a fourth portion of the first semiconductor layer. The third portion of the first semiconductor layer and the fourth portion of the first semiconductor layer are doped to provide a first top source/drain region for the first VTFET.

The semiconductor structure may further comprise a second bottom source/drain contact for the second VTFET disposed over the top surface of the isolation layer and surrounding a first portion of the second semiconductor layer, a second bottom spacer disposed over a top surface of the second bottom source/drain contact and surrounding a second portion of the second semiconductor layer, a second gate stack disposed over a top surface of the second bottom spacer and surrounding a third portion of the second semiconductor layer, and a second top spacer disposed over a top surface of the second gate stack and surrounding a fourth portion of the second semiconductor layer. The first portion of the second semiconductor layer and the second portion of the second semiconductor layer are doped to provide a second bottom source/drain region for the second VTFET. The fourth portion of the second semiconductor layer and a fifth portion of the second semiconductor layer disposed over the fourth portion of the second semiconductor layer are doped to provide a second top source/drain region for the second VTFET.

The semiconductor structure may further comprise a second top/source drain contact for the second VTFET surrounding the fifth portion of the second semiconductor layer and disposed over a top surface of the second semiconductor layer, and an interlayer dielectric disposed over the second top spacer and surrounding the second top/source drain contact.

The semiconductor structure may further comprise a first sidewall spacer having a first vertical surface disposed adjacent a first sidewall of the interlayer dielectric, the second top spacer, the second gate stack, and the second bottom spacer, wherein the second bottom source/drain contact is further disposed adjacent a second vertical surface of the first sidewall spacer. The semiconductor structure may further comprise a second sidewall spacer having a first vertical surface disposed adjacent a second sidewall of the interlayer dielectric, the second top spacer, the second gate stack, the second bottom spacer, and the isolation layer, wherein the first top source/drain contact is further disposed adjacent a second vertical surface of the second sidewall spacer.

The semiconductor structure may further comprise a first sidewall spacer having a first vertical surface disposed adjacent a first sidewall of the interlayer dielectric, the second top spacer, the second gate stack, and the second bottom spacer, wherein the first top source/drain contact and the second bottom source/drain contact comprise a shared contact disposed adjacent a second vertical surface of the first sidewall spacer and adjacent a first edge of the isolation layer.

The semiconductor structure may further comprise a first sidewall spacer having a first vertical surface spaced apart from a first end of the at least one vertical fin disposed adjacent a first end of the interlayer dielectric, the second top spacer, the second gate stack, the second bottom spacer, the isolation layer, the first top spacer, the first gate stack and the first bottom spacer, and a first bottom source/drain contact for the first VTFET disposed over a top surface of the substrate and adjacent a second vertical surface of the first sidewall spacer.

The semiconductor structure may further comprise a shared gate contact to the first gate stack and the second gate stack disposed in the interlayer dielectric, the second top spacer, the second gate stack, the second bottom spacer and the first top spacer spaced apart from a second end of the at least one vertical fin.

In some embodiments, an integrated circuit comprises a stacked VTFET structure comprising a substrate, at least one vertical fin disposed over a top surface of the substrate, a first VTFET disposed over the top surface of the substrate surrounding a first portion of the at least one vertical fin, an isolation layer disposed over the first VTFET surrounding a second portion of the at least one vertical fin, and a second VTFET disposed over a top surface of the isolation layer surrounding a third portion of the at least one vertical fin. The first portion of the at least one vertical fin comprises a first semiconductor layer with a first crystalline orientation providing a first vertical transport channel for the first VTFET, the second portion of the at least one vertical fin comprises an insulator, and the third portion of the at least one vertical fin comprises a second semiconductor layer with a second crystalline orientation providing a second vertical transport channel for the second VTFET.

The first crystalline orientation may provide a first vertical transport orientation for one of an nFET and a pFET, and the second crystalline orientation may provide a vertical transport orientation for the other one of an nFET and a pFET.

The first semiconductor layer may comprise silicon with one of a (110) crystalline orientation and a (100) crystalline orientation, and the second semiconductor layer may comprise silicon with the other one of the (110) crystalline orientation and the (100) crystalline orientation.

In some embodiments, a method of forming a semiconductor structure comprises forming at least one vertical fin over a top surface of a substrate, forming a first VTFET over the top surface of the substrate surrounding a first portion of the at least one vertical fin, forming an isolation layer over the first VTFET surrounding a second portion of the at least one vertical fin, and forming a second VTFET over a top surface of the isolation layer surrounding a third portion of the at least one vertical fin. The first portion of the at least one vertical fin comprises a first semiconductor layer with a first crystalline orientation providing a first vertical transport channel for the first VTFET, the second portion of the at least one vertical fin comprises an insulator, and the third portion of the at least one vertical fin comprises a second semiconductor layer with a second crystalline orientation providing a second vertical transport channel for the second VTFET.

The first crystalline orientation may provide a first vertical transport orientation for one of an nFET and a pFET, and the second crystalline orientation may provide a vertical transport orientation for the other one of an nFET and a pFET.

The first semiconductor layer may comprise silicon with one of a (110) crystalline orientation and a (100) crystalline orientation, and the second semiconductor layer may comprise silicon with the other one of the (110) crystalline orientation and the (100) crystalline orientation.

Forming the at least one vertical fin may comprise patterning a hard mask over a layered stack comprising the first semiconductor layer, the insulator and the second semiconductor layer, and etching exposed portions of the layered stack to form the at least one vertical fin.

The method may further comprise: forming a doped region proximate the top surface of the substrate and in a first portion of the first semiconductor layer, wherein the doped region provides a first bottom source/drain region for the first VTFET; forming a first bottom spacer over the top surface of the substrate and surrounding the first portion of the first semiconductor layer; forming a first gate stack over a top surface of the first bottom spacer and surrounding a second portion of the first semiconductor layer; forming a first top spacer over a top surface of the first gate stack and surrounding a third portion of the first semiconductor layer; forming a first silicate glass layer over a top surface of the first top spacer and surrounding a fourth portion of the first semiconductor layer; and forming the isolation layer over the first silicate glass layer and surrounding the insulator of the at least one vertical fin. The first silicate glass layer comprises one of an n-type dopant material and a p-type dopant material.

The method may further comprise: forming a second silicate glass layer over the top surface of the isolation layer and surrounding a first portion of the second semiconductor layer, forming a second bottom spacer over a top surface of the second silicate glass layer and surrounding a second portion of the second semiconductor layer; forming a second gate stack over a top surface of the second bottom spacer and surrounding a third portion of the second semiconductor layer; forming a second top spacer over a top surface of the second gate stack and surrounding a fourth portion of the second semiconductor layer; and forming a third silicate glass layer over a top surface of the second top spacer and surrounding a fifth portion of the second semiconductor layer. The second silicate glass layer and the third silicate glass layer comprise the other one of the n-type dopant material and the p-type dopant material.

The method may further comprise performing a dopant drive-in to drive dopants from the first, second and third silicate glass layers to form: a first top source/drain region for the first VTFET in the third portion of the first semiconductor layer and the fourth portion of the first semiconductor layer, a second bottom source/drain region for the second VTFET in the first portion of the second semiconductor layer and the second portion of the second semiconductor layer, and a second top source/drain region for the second VTFET in the fourth portion of the second semiconductor layer, the fifth portion of the second semiconductor layer, and a sixth portion of the second semiconductor layer over the fifth portion of the second semiconductor layer.

The method may further comprise removing the third silicate glass layer and forming an interlayer dielectric over the second top spacer and encapsulating the fifth portion of the second semiconductor layer, the sixth portion of the second semiconductor layer and a hard mask over the sixth portion of the second semiconductor layer.

The method may further comprise: etching a first portion of the interlayer dielectric, the second top spacer, the second gate stack and the second bottom spacer apart from a first sidewall of the at least one vertical fin; forming a first sidewall spacer adjacent edges of the etched first portion of the interlayer dielectric, the second top spacer, the second gate stack, and the second bottom spacer; removing the second silicate glass layer; depositing contact material to form a second bottom source/drain contact for the second VTFET, the second top source/drain contact wrapping around the first portion of the second semiconductor layer exposed by removal of the second silicate glass layer; etching a second portion of the interlayer dielectric, the second top spacer, the second gate stack, the second bottom spacer, the second top source/drain contact, and the isolation layer apart from a second sidewall of the at least one vertical fin; forming a second sidewall spacer adjacent edges of the etched second portion of the interlayer dielectric, the second top spacer, the second gate stack, the second bottom spacer, the second top source/drain contact and the isolation layer; removing the first silicate glass layer; and depositing contact material to form a first top source/drain contact for the first VTFET, the first top source/drain contact wrapping around the fourth portion of the first semiconductor layer exposed by removal of the first silicate glass layer.

The method may further comprise: etching a first portion of the interlayer dielectric, the second top spacer, the second gate stack, the second bottom spacer, the second silicate glass layer and the isolation layer apart from a first sidewall of the at least one vertical fin; forming a first sidewall spacer adjacent edges of the etched first portion of the interlayer dielectric, the second top spacer, the second gate stack, and the second bottom spacer; removing the second silicate glass layer and the first silicate glass layer; and depositing contact material to form a shared contact to the second bottom source/drain region of the second VTFET and the first top source/drain region of the first VTFET, the shared contact wrapping around the first portion of the second semiconductor layer and the fourth portion of the first semiconductor layer exposed by removal of the second silicate glass layer and the first silicate glass layer.

The method may further comprise: etching portions of the interlayer dielectric, the second top spacer, the second gate stack, the second bottom spacer, the second silicate glass layer, the isolation layer, the first silicate glass layer, the first top spacer, the first gate stack and the first bottom spacer to expose a portion of a top surface of the substrate spaced apart from a first end of the at least one vertical fin; forming a sidewall spacer having a first vertical surface at etched edges of the interlayer dielectric, the second top spacer, the second gate stack, the second bottom spacer, the second silicate glass layer, the isolation layer, the first silicate glass layer, the first top spacer, the first gate stack and the first bottom spacer; depositing contact material to form a first bottom source/drain contact to the first bottom source/drain region of the first VTFET adjacent a second vertical surface of the sidewall spacer over the exposed top surface of the substrate; etching portions of the interlayer dielectric, the second top spacer, the second gate stack, the second bottom spacer, the second silicate glass layer, the isolation layer, the first silicate glass layer and the first top spacer to form an exposed portion spaced apart from a second end of the at least one vertical fin; and depositing contact material in the exposed portion to form a shared gate contact to the first gate stack of the first VTFET and the second gate stack of the second VTFET.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a substrate;
   at least one vertical fin disposed over a top surface of the substrate;
   a first vertical transport field-effect transistor disposed over the top surface of the substrate surrounding a first portion of the at least one vertical fin;
   an isolation layer disposed over the first vertical transport field-effect transistor surrounding a second portion of the at least one vertical fin; and
   a second vertical transport field-effect transistor disposed over a top surface of the isolation layer surrounding a third portion of the at least one vertical fin;
   wherein the first portion of the at least one vertical fin comprises a first semiconductor layer with a first crystalline orientation providing a first vertical transport channel for the first vertical transport field-effect transistor;
   wherein the second portion of the at least one vertical fin comprises an insulator; and
   wherein the third portion of the at least one vertical fin comprises a second semiconductor layer with a second crystalline orientation providing a second vertical transport channel for the second vertical transport field-effect transistor;
   a first bottom source/drain region for the first vertical transport field-effect transistor, the first bottom source/drain region comprising a doped region proximate the top surface of the substrate and a doped region of a first portion of the first semiconductor layer proximate the top surface of the substrate;
   a first bottom spacer disposed over the top surface of the substrate and surrounding the first portion of the first semiconductor layer;
   a first gate stack disposed over a top surface of the first bottom spacer and surrounding a second portion of the first semiconductor;
   a first top spacer disposed over a top surface of the first gate stack and surrounding a third portion of the first semiconductor layer; and
   a first top source/drain contact for the first vertical transport field-effect transistor disposed over a top surface of the first top spacer and surrounding a fourth portion of the first semiconductor layer;
   wherein the third portion of the first semiconductor layer and the fourth portion of the first semiconductor layer are doped to provide a first top source/drain region for the first vertical transport field-effect transistor.

2. The semiconductor structure of claim 1, wherein the first crystalline orientation provides a first vertical transport orientation for one of an n-type field-effect transistor (nFET) and a p-type field-effect transistor (pFET), and wherein the second crystalline orientation provides a vertical transport orientation for the other one of an nFET and a pFET.

3. The semiconductor structure of claim 1, wherein the first semiconductor layer comprises silicon with one of a (110) crystalline orientation and a (100) crystalline orientation, and wherein the second semiconductor layer comprises silicon with the other one of the (110) crystalline orientation and the (100) crystalline orientation.

4. The semiconductor structure of claim 1, further comprising:
a second bottom source/drain contact for the second vertical transport field-effect transistor disposed over the top surface of the isolation layer and surrounding a first portion of the second semiconductor layer;
a second bottom spacer disposed over a top surface of the second bottom source/drain contact and surrounding a second portion of the second semiconductor layer;
a second gate stack disposed over a top surface of the second bottom spacer and surrounding a third portion of the second semiconductor layer; and
a second top spacer disposed over a top surface of the second gate stack and surrounding a fourth portion of the second semiconductor layer;
wherein the first portion of the second semiconductor layer and the second portion of the second semiconductor layer are doped to provide a second bottom source/drain region for the second vertical transport field-effect transistor; and
wherein the fourth portion of the second semiconductor layer and a fifth portion of the second semiconductor layer disposed over the fourth portion of the second semiconductor layer are doped to provide a second top source/drain region for the second vertical transport field-effect transistor.

5. The semiconductor structure of claim 4, further comprising:
a second top/source drain contact for the second vertical transport field-effect transistor surrounding the fifth portion of the second semiconductor layer and disposed over a top surface of the second semiconductor layer; and
an interlayer dielectric disposed over the second top spacer and surrounding the second top/source drain contact.

6. The semiconductor structure of claim 5, further comprising a first sidewall spacer having a first vertical surface disposed adjacent a first sidewall of the interlayer dielectric, the second top spacer, the second gate stack, and the second bottom spacer, wherein the second bottom source/drain contact is further disposed adjacent a second vertical surface of the first sidewall spacer.

7. The semiconductor structure of claim 6, further comprising a second sidewall spacer having a first vertical surface disposed adjacent a second sidewall of the interlayer dielectric, the second top spacer, the second gate stack, the second bottom spacer, and the isolation layer, wherein the first top source/drain contact is further disposed adjacent a second vertical surface of the second sidewall spacer.

8. The semiconductor structure of claim 5, further comprising a first sidewall spacer having a first vertical surface disposed adjacent a first sidewall of the interlayer dielectric, the second top spacer, the second gate stack, and the second bottom spacer, wherein the first top source/drain contact and the second bottom source/drain contact comprise a shared contact disposed adjacent a second vertical surface of the first sidewall spacer and adjacent a first edge of the isolation layer.

9. The semiconductor structure of claim 4, further comprising:
a first sidewall spacer having a first vertical surface spaced apart from a first end of the at least one vertical fin disposed adjacent a first end of the interlayer dielectric, the second top spacer, the second gate stack, the second bottom spacer, the isolation layer, the first top spacer, the first gate stack and the first bottom spacer; and
a first bottom source/drain contact for the first vertical transport field effect transistor disposed over a top surface of the substrate and adjacent a second vertical surface of the first sidewall spacer.

10. The semiconductor structure of claim 9, further comprising a shared gate contact to the first gate stack and the second gate stack disposed in the interlayer dielectric, the second top spacer, the second gate stack, the second bottom spacer and the first top spacer spaced apart from a second end of the at least one vertical fin.

11. An integrated circuit comprising:
a stacked vertical transport field-effect transistor structure comprising:
a substrate;
at least one vertical fin disposed over a top surface of the substrate;
a first vertical transport field-effect transistor disposed over the top surface of the substrate surrounding a first portion of the at least one vertical fin;
an isolation layer disposed over the first vertical transport field-effect transistor surrounding a second portion of the at least one vertical fin; and
a second vertical transport field-effect transistor disposed over a top surface of the isolation layer surrounding a third portion of the at least one vertical fin;
wherein the first portion of the at least one vertical fin comprises a first semiconductor layer with a first crystalline orientation providing a first vertical transport channel for the first vertical transport field-effect transistor;
wherein the second portion of the at least one vertical fin comprises an insulator; and
wherein the third portion of the at least one vertical fin comprises a second semiconductor layer with a second crystalline orientation providing a second vertical transport channel for the second vertical transport field-effect transistor;
a first bottom source/drain region for the first vertical transport field-effect transistor, the first bottom source/drain region comprising a doped region proximate the top surface of the substrate and a doped region of a first portion of the first semiconductor layer proximate the top surface of the substrate;
a first bottom spacer disposed over the top surface of the substrate and surrounding the first portion of the first semiconductor layer;
a first gate stack disposed over a top surface of the first bottom spacer and surrounding a second portion of the first semiconductor;
a first top spacer disposed over a top surface of the first gate stack and surrounding a third portion of the first semiconductor layer; and
a first top source/drain contact for the first vertical transport field-effect transistor disposed over a top surface of the first top spacer and surrounding a fourth portion of the first semiconductor layer;
wherein the third portion of the first semiconductor layer and the fourth portion of the first semiconductor layer are doped to provide a first top source/drain region for the first vertical transport field-effect transistor.

12. The integrated circuit of claim 11, wherein the first crystalline orientation provides a first vertical transport orientation for one of an n-type field-effect transistor (nFET) and a p-type field-effect transistor (pFET), and wherein the second crystalline orientation provides a vertical transport orientation for the other one of an nFET and a pFET.

13. The integrated circuit of claim 11, wherein the first semiconductor layer comprises silicon with one of a (110) crystalline orientation and a (100) crystalline orientation, and wherein the second semiconductor layer comprises silicon with the other one of the (110) crystalline orientation and the (100) crystalline orientation.

14. A method of forming a semiconductor structure, comprising:
    forming at least one vertical fin over a top surface of a substrate;
    forming a first vertical transport field-effect transistor over the top surface of the substrate surrounding a first portion of the at least one vertical fin;
    forming an isolation layer over the first vertical transport field-effect transistor surrounding a second portion of the at least one vertical fin; and
    forming a second vertical transport field-effect transistor over a top surface of the isolation layer surrounding a third portion of the at least one vertical fin;
    wherein the first portion of the at least one vertical fin comprises a first semiconductor layer with a first crystalline orientation providing a first vertical transport channel for the first vertical transport field-effect transistor;
    wherein the second portion of the at least one vertical fin comprises an insulator; and
    wherein the third portion of the at least one vertical fin comprises a second semiconductor layer with a second crystalline orientation providing a second vertical transport channel for the second vertical transport field-effect transistor;
    forming a first bottom source/drain region for the first vertical transport field-effect transistor, the first bottom source/drain region comprising a doped region proximate the top surface of the substrate and a doped region of a first portion of the first semiconductor layer proximate the top surface of the substrate;
    forming a first bottom spacer over the top surface of the substrate and surrounding the first portion of the first semiconductor layer;
    forming a first gate stack over a top surface of the first bottom spacer and surrounding a second portion of the first semiconductor;
    forming a first top spacer over a top surface of the first gate stack and surrounding a third portion of the first semiconductor layer; and
    forming a first top source/drain contact for the first vertical transport field-effect transistor over a top surface of the first top spacer and surrounding a fourth portion of the first semiconductor layer;
    wherein the third portion of the first semiconductor layer and the fourth portion of the first semiconductor layer are doped to provide a first top source/drain region for the first vertical transport field-effect transistor.

15. The method of claim 14, wherein the first crystalline orientation provides a first vertical transport orientation for one of an n-type field-effect transistor (nFET) and a p-type field-effect transistor (pFET), and wherein the second crystalline orientation provides a vertical transport orientation for the other one of an nFET and a pFET.

16. The method of claim 14, wherein the first semiconductor layer comprises silicon with one of a (110) crystalline orientation and a (100) crystalline orientation, and wherein the second semiconductor layer comprises silicon with the other one of the (110) crystalline orientation and the (100) crystalline orientation.

17. The method of claim 14, wherein forming the at least one vertical fin comprises:
    patterning a hard mask over a layered stack comprising the first semiconductor layer, the insulator and the second semiconductor layer; and
    etching exposed portions of the layered stack to form the at least one vertical fin.

18. A method of forming a semiconductor structure, comprising:
    forming at least one vertical fin over a top surface of a substrate;
    forming a first vertical transport field-effect transistor over the top surface of the substrate surrounding a first portion of the at least one vertical fin;
    forming an isolation layer over the first vertical transport field-effect transistor surrounding a second portion of the at least one vertical fin; and
    forming a second vertical transport field-effect transistor over a top surface of the isolation layer surrounding a third portion of the at least one vertical fin;
    wherein the first portion of the at least one vertical fin comprises a first semiconductor layer with a first crystalline orientation providing a first vertical transport channel for the first vertical transport field-effect transistor;
    wherein the second portion of the at least one vertical fin comprises an insulator; and
    wherein the third portion of the at least one vertical fin comprises a second semiconductor layer with a second crystalline orientation providing a second vertical transport channel for the second vertical transport field-effect transistor;
    forming a doped region proximate the top surface of the substrate and in a first portion of the first semiconductor layer, wherein the doped region provides a first bottom source/drain region for the first vertical transport field-effect transistor;
    forming a first bottom spacer over the top surface of the substrate and surrounding the first portion of the first semiconductor layer;
    forming a first gate stack over a top surface of the first bottom spacer and surrounding a second portion of the first semiconductor layer;
    forming a first top spacer over a top surface of the first gate stack and surrounding a third portion of the first semiconductor layer;
    forming a first silicate glass layer over a top surface of the first top spacer and surrounding a fourth portion of the first semiconductor layer; and
    forming the isolation layer over the first silicate glass layer and surrounding the insulator of the at least one vertical fin;
    wherein the first silicate glass layer comprises one of an n-type dopant material and a p-type dopant material.

19. The method of claim 18, further comprising:
    forming a second silicate glass layer over the top surface of the isolation layer and surrounding a first portion of the second semiconductor layer;
    forming a second bottom spacer over a top surface of the second silicate glass layer and surrounding a second portion of the second semiconductor layer;
    forming a second gate stack over a top surface of the second bottom spacer and surrounding a third portion of the second semiconductor layer;

forming a second top spacer over a top surface of the second gate stack and surrounding a fourth portion of the second semiconductor layer; and forming a third silicate glass layer over a top surface of the second top spacer and surrounding a fifth portion of the second semiconductor layer;

wherein the second silicate glass layer and the third silicate glass layer comprise the other one of the n-type dopant material and the p-type dopant material.

20. The method of claim 19, further comprising performing a dopant drive-in to drive dopants from the first, second and third silicate glass layers to form:

a first top source/drain region for the first vertical transport field-effect transistor in the third portion of the first semiconductor layer and the fourth portion of the first semiconductor layer;

a second bottom source/drain region for the second vertical transport field-effect transistor in the first portion of the second semiconductor layer and the second portion of the second semiconductor layer; and a second top source/drain region for the second vertical transport field-effect transistor in the fourth portion of the second semiconductor layer, the fifth portion of the second semiconductor layer, and a sixth portion of the second semiconductor layer over the fifth portion of the second semiconductor layer.

21. The method of claim 20, further comprising:
removing the third silicate glass layer; and
forming an interlayer dielectric over the second top spacer and encapsulating the fifth portion of the second semiconductor layer, the sixth portion of the second semiconductor layer and a hard mask over the sixth portion of the second semiconductor layer.

22. The method of claim 21, further comprising:
etching a first portion of the interlayer dielectric, the second top spacer, the second gate stack and the second bottom spacer apart from a first sidewall of the at least one vertical fin;

forming a first sidewall spacer adjacent edges of the etched first portion of the interlayer dielectric, the second top spacer, the second gate stack, and the second bottom spacer;

removing the second silicate glass layer;

depositing contact material to form a second bottom source/drain contact for the second vertical transport field-effect transistor, the second top source/drain contact wrapping around the first portion of the second semiconductor layer exposed by removal of the second silicate glass layer;

etching a second portion of the interlayer dielectric, the second top spacer, the second gate stack, the second bottom spacer, the second top source/drain contact, and the isolation layer apart from a second sidewall of the at least one vertical fin;

forming a second sidewall spacer adjacent edges of the etched second portion of the interlayer dielectric, the second top spacer, the second gate stack, the second bottom spacer, the second top source/drain contact and the isolation layer;

removing the first silicate glass layer; and depositing contact material to form a first top source/drain contact for the first vertical transport field effect transistor, the first top source/drain contact wrapping around the fourth portion of the first semiconductor layer exposed by removal of the first silicate glass layer.

23. The method of claim 21, further comprising:
etching a first portion of the interlayer dielectric, the second top spacer, the second gate stack, the second bottom spacer, the second silicate glass layer and the isolation layer apart from a first sidewall of the at least one vertical fin;

forming a first sidewall spacer adjacent edges of the etched first portion of the interlayer dielectric, the second top spacer, the second gate stack, and the second bottom spacer;

removing the second silicate glass layer and the first silicate glass layer; and depositing contact material to form a shared contact to the second bottom source/drain region of the second vertical transport field-effect transistor and the first top source/drain region of the first vertical transport field effect transistor, the shared contact wrapping around the first portion of the second semiconductor layer and the fourth portion of the first semiconductor layer exposed by removal of the second silicate glass layer and the first silicate glass layer.

24. The method of claim 21, further comprising:
etching portions of the interlayer dielectric, the second top spacer, the second gate stack, the second bottom spacer, the second silicate glass layer, the isolation layer, the first silicate glass layer, the first top spacer, the first gate stack and the first bottom spacer to expose a portion of a top surface of the substrate spaced apart from a first end of the at least one vertical fin;

forming a sidewall spacer having a first vertical surface at etched edges of the interlayer dielectric, the second top spacer, the second gate stack, the second bottom spacer, the second silicate glass layer, the isolation layer, the first silicate glass layer, the first top spacer, the first gate stack and the first bottom spacer;

depositing contact material to form a first bottom source/drain contact to the first bottom source/drain region of the first vertical transport field-effect transistor adjacent a second vertical surface of the sidewall spacer over the exposed top surface of the substrate;

etching portions of the interlayer dielectric, the second top spacer, the second gate stack, the second bottom spacer, the second silicate glass layer, the isolation layer, the first silicate glass layer and the first top spacer to form an exposed portion spaced apart from a second end of the at least one vertical fin; and depositing contact material in the exposed portion to form a shared gate contact to the first gate stack of the first vertical transport field-effect transistor and the second gate stack of the second vertical transport field-effect transistor.

25. The method of claim 18, wherein the first silicate glass layer comprises one of phosphosilicate glass and borosilicate glass.

* * * * *